United States Patent
Van Der Zaag et al.

(10) Patent No.: US 6,494,108 B1
(45) Date of Patent: Dec. 17, 2002

(54) MAGNETOSTRICTIVE STRESS SENSOR

(76) Inventors: Pieter J. Van Der Zaag, Prof. Holstlaan 6, 5656 AA Eindhoven (NL); Gerardus H. J. Somers, Prof. Holstlaan 6, 5656 AA Eindhoven (NL)

(*) Notice: Subject to any disclaimer, the term of this patent is extended or adjusted under 35 U.S.C. 154(b) by 0 days.

(21) Appl. No.: 09/261,846

(22) Filed: Mar. 3, 1999

(30) Foreign Application Priority Data

Mar. 5, 1998 (EP) .......................................... 98200686

(51) Int. Cl.$^7$ ................................................ G01L 3/02
(52) U.S. Cl. ................................................ 73/862.333
(58) Field of Search ................ 73/862.333, 862.69, 73/779, 776; 324/252, 208; 360/113

(56) References Cited

U.S. PATENT DOCUMENTS

| | | | |
|---|---|---|---|
| 3,861,203 A | | 1/1975 | Dahle et al. ................. 73/88.5 |
| 4,783,711 A | * | 11/1988 | Kitada et al. ................ 360/113 |
| 5,142,227 A | * | 8/1992 | Fish ............................. 73/779 |
| 5,297,439 A | * | 3/1994 | Tyren et al. ............. 73/862.69 |
| 5,652,394 A | * | 7/1997 | Sugino et al. ................. 73/774 |

FOREIGN PATENT DOCUMENTS

EP 0767984 4/1997

OTHER PUBLICATIONS

"Physics of Magnetism", by S. Chikazumi, Wiley & Sons, 1986, pp. 161–185.
"The Intitial Permeability of Polycrystalline MnZn Ferrites: The Influence of Domain and Microstructure", by P.J. v.d. Zaag, J. Appl. Phys. 74(6), Sep. 1993, pp. 4085–4095.
"Nature", by S.I. Tomkeieff, vol. 155, 1945, p. 24.

* cited by examiner

*Primary Examiner*—Max Noori
(74) *Attorney, Agent, or Firm*—Ernestine C. Bartlett

(57) ABSTRACT

A magnetostrictive stress sensor is provided with a soft-ferromagnetic body having a grain structure, at least a part of the grains having a grain size in the transition region between the one-domain and the two-domain state. At this grain size, which is of the order of 1 to 9 $\mu$m for a ferrite body, a relatively large magnetostrictive effect occurs. In a practical embodiment, the ferromagnetic body is formed by a ferrite core, in particular a ferrite ring, around at least a part of which an electric oil is wound, which is incorporated in a measuring circuit for measuring changes in the self-induction of the coil under the influence of mechanical pressure exerted on the ferrite core.

9 Claims, 2 Drawing Sheets

MAGNETOSTRICTIVE STRESS SENSOR

BACKGROUND OF THE INVENTION

The invention relates to a magnetostrictive stress sensor, which is provided with a soft-ferromagnetic body. An example of such a ferromagnetic body is a polycrystalline ferrite. Such a so-called polycrystalline ferrite exhibits magnetic properties which are determined, inter alia, by the inherent grain structure.

Owing to the fact that conventional stress sensors provided with strain gauges are relatively expensive, stress sensors have been developed which use the magnetostrictive effect of ferromagnetic materials. These materials have the property that, on the application of a mechanical pressure, they demonstrate a change in the permeability ($\mu$) as a result of the so-called magnetostrictive effect. This phenomenon is explained in greater detail by S. Chikazumi in *Physics of Magnetism*, John Wiley & Sons (reprinted edition 1986); see chapter 8, and more particularly paragraph 8.4.

A description of a magnetostrictive stress sensor is given in EP-A-0 767 984 (PHN 15.309), filed by the current applicant. In said document, the ferromagnetic body is formed by a ferrite ring around at least a part of which an electric coil is wound. This coil is connected to an electric circuit to measure the self-induction (L) of the coil, since a change in permeability $\mu$ of the ferrite caused by mechanical stress entails a changed value of the self-induction L.

Customarily used ferrites are used in practice, for example, as transformer coils in a frequency range from 10 to 100 kHz and generally have a grain size D which is larger than or equal to 20 $\mu$m. In addition, at this grain size the permeability exhibits a very high value. Such a grain size leads to a relatively low corectivity $H_c$, is inversely proportional to D, and hence to small energy losses. Since, however, the magnetostrictive effect at this grain size is small, the sensitivity of the stress sensors based hereon is rather limited.

An internationally employed definition of the grain size of ferrites is stated in the publication: The initial permeability of polycrystalline MnZn ferrites: The influence of domain and microstructure by P. J. van der Zaag c.s. in *J. Appl. Phys.* 74 (6), Sept. 15 1993, pp. 4085–4095. The grain size (D), also referred to as the "mean linear intercept value", corresponds to the mean length of a chord along an arbitrary line across a microstructure picture of a ferrite. This definition of the grain size is independent of the shape of the grains. A more mathematical approach of this term had been previously given by S. I. Tomkeieff in *Nature*, vol. 155 (1945), page 24.

SUMMARY OF THE INVENTION

It is an object of the invention to considerably increase the sensitivity of magnetostrictive stress sensors.

To achieve this, the magnetostrictive stress sensor as described in the opening paragraph is characterized in accordance with the invention in that, the ferromagnetic body has a grain structure such that at least a part of the grains have a grain size in the transition region between the one-domain and the two-domain state. In this connection, the term stress is to be taken to mean the force per unit area.

The one-domain state is the state in which a grain is completely magnetized in one-direction; in this state, the domain size ($\Delta$) corresponds to the grain size D. The two-domain state is the state in which a domain wall is present within each grain, and the magnetization direction in both domain parts is different. Here, the domain size $\Delta$, which is determined by means of a neutron-depolarization technique, is smaller than the grain size D. In the above-mentioned publication in J. Appl. Phys., the grain size is determined at which the intragranular domain structure changes from the one-domain state to the two-domain state. In this point of transition, the grain size is such that the domain wall energy (which determines the two-domain state) is substantially equal to the magnetostatic energy (which determines the one-domain state). With reference to the above-mentioned publication in J. Appl. Phys., the grain size $D_c$ in this point of transition may be given roughly as $$D_c \approx \frac{4\mu_r}{\mu_0 M_s^2} \left( \frac{2kT_c|K|}{a} \right)^{1/2}$$

wherein k is the Boltzmann constant, K is the magnetocrystalline anistropy constant, a is the distance between the exchange-coupled spins, $\mu_0$ is the absolute permeability of vacuum, $\mu_r$ is the relative permeability, $M_s$ is the saturation magnetization and $T_c$ is the Curie temperature. Particularly in the case of MnZn-ferrites, NiZn-ferrites, MgMnZn-ferrites, LiNiZn-ferrites, the grain size for this point of transition ranges from 1 to 9 $\mu$m. The above-mentioned article in J. Appl. Phys. shows that fine-grain ferrites, particularly ferrites having a grain size in the range from 0.2 to 16 $\mu$m, a part of which will consequently be in the domain-transition region, are known per se. The ferrites whose D is smaller than or equal to 10 $\mu$m are employed in special transformer coils which must be used in the MHz range. The limited use of ferrites whose grain size is such that they are in the transition region from the one-domain to the two-domain state can be partly attributed to the fact that they are unstable in terms of losses/dissipation.

Inventors have discovered, that it is exactly in the transition region between the one-domain state and the two-domain state where the magnetostrictive effect is found to be maximal, that is up to a factor of 5 to 12 greater than outside this transition region. It is this discovery that has made the use of ferrites having a grain size in the domain transition region attractive for stress sensors.

As a result, a magnetostrictive stress sensor comprising a ferrite whose grain size in the domain transition region, that is in the range from 1 to 9 $\mu$m for the ferrite materials used, turns out to be very sensitive, i.e. a small change in pressure already leads to a considerable change of the permeability. It has further been found that, in the case of a microstructure in the domain transition region, the addition of a specific quantity of Co, of typically 5 at % maximal, has a positive effect on the magnetostriction.

The magnetostrictive effect causes the permeability to change in the case of a change in mechanical stress. In order to measure this change in permeability, the ferromagnetic body is formed by a ferrite ring around at least a part of which an electric coil is wound, which is accommodated in a measuring circuit for measuring changes in the self-induction of the coil under the influence of a mechanical pressure exerted on the ferrite ring. The change in permeability brought about by the changed mechanical stress causes, as is known, a changed self-induction in the coil.

The invention does not only relate to a stress sensor but also to a weighing apparatus, which is provided with at least one stress sensor of the type described hereinabove. By using the magnetostrictive effect, which manifests itself strongly in the case of a specific choice of the ferrite grain structure, the pressure exerted on these stress sensors may be directly converted to an electrical signal. In relation to conventional weighing apparatus, in which use is made of relatively complicated mechanical transmission means, in particular all kinds of mass-spring systems, the weighing apparatus in accordance with the invention exhibits a very rapid response and can be produced relatively cheaply in large numbers. In addition, a weighing apparatus in accordance with the invention can very suitably be used in a moist and corrosive environment.

Therefore, the invention relates broadly to a weighing apparatus comprising a ferromagnetic body which is formed by a ferrite ring around at least a part of which an electric coil is wound, which is accommodated in a measuring circuit for measuring circuit for measuring changes in the self-induction of the coil under the influence of mechanical pressure exerted on the ferrite ring.

In a particular embodiment, the measuring circuit comprises a resonance circuit in which the ferrite ring with the coil are incorporated, and a change of the self-induction of the coil is measured by establishing that a change in the signal strength of a measuring frequency has taken place, which measuring frequency is situated at a relatively small distance from the resonance frequency of the resonance circuit.

In a practical application, the weighing apparatus is provided with a support for an object to be measured, which support is supported by a number of ferrite rings of which the coils surrounding them are incorporated in the resonance circuit. The support may be formed, for example, by a plate on which, for example, large objects, such as cars can be placed, a scale, for example, for weighing babies or a stand via which, for example, an artificial manure spreader is placed on the back of a tractor, and the reduction in weight of which during spreading manure can be established, etc.

Apart from a weighing apparatus, the magnetostrictive stress sensor can be used for all applications requiring a sensitive pressure measurement. For example, in the above-mentioned EP-A-0 767 984, a description is given of an apparatus for recharging batteries, in which use is made of magnetostrictive stress sensors. Also in this apparatus, the measuring sensitivity can be increased by using a stress sensor having the specific grain structure described hereinabove. The invention will be apparent from the elucidated with reference to the embodiments described hereinafter.

DESCRIPTION OF THE PREFERRED EMBODIMENTS

Figure 1A:
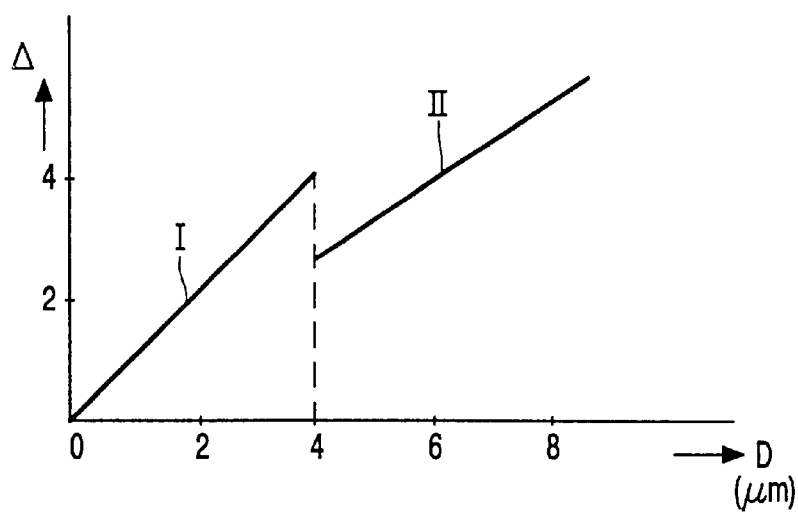
FIGS. 1A, 1B and 1C show three diagrams to explain the properties of the selected ferrite materials.
Figure 1B:
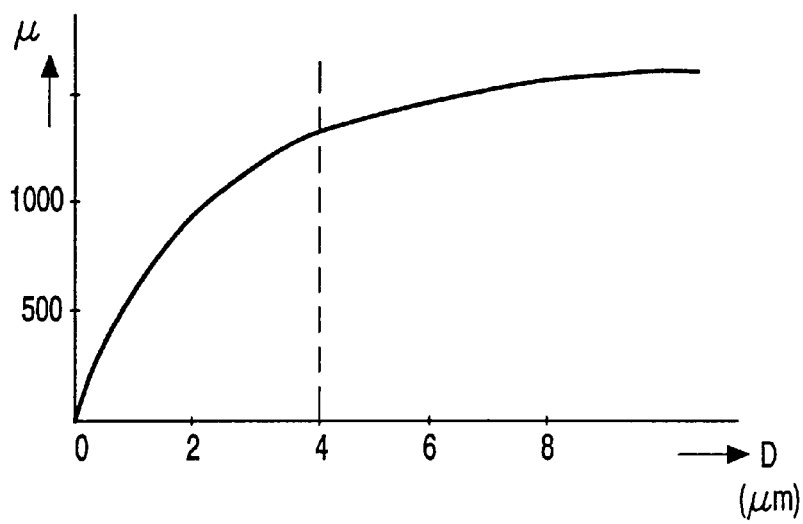
Figure 1C:
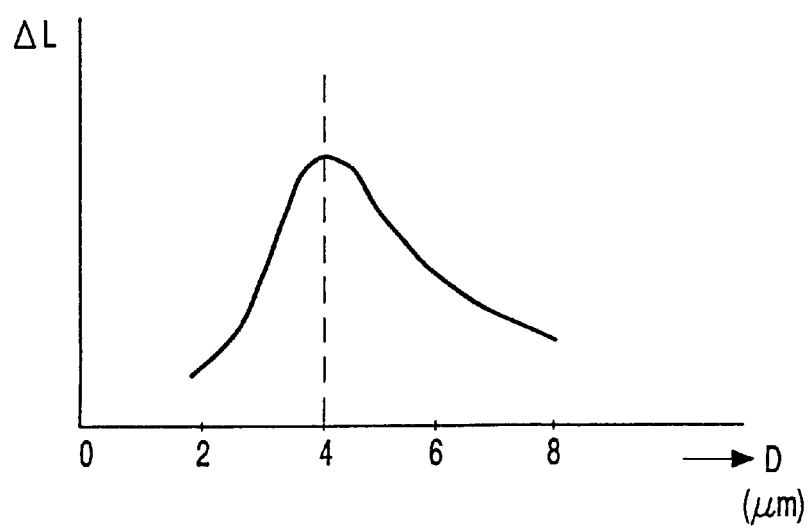

In FIG. 1A, the ratio between the domain size $\Delta$ and the grain size D of the ferrite material is depicted. The one-domain region is indicated by the line I and the two-domain region by the line II. When use is made of a MnZn-ferrite, the transition region is approximately at 4 μm. FIG. 1B shows the ratio between the permeability (without magnetostrictive effect) $\mu$ and the grain size D of the ferrite material. In FIG. 1C, the magnetostrictive effect, as it becomes manifest in a change of the self-induction of the coil wound about the ferrite material, is plotted against the grain size D. At the transition from the one-domain region to the two-domain region, this effect is much greater than the occurring, in particular, in the currently customary grain sizes. As mentioned above, the difference may amount to a factor of 5 to 12. In the case of an MnZn-ferrite, an increase of $\Delta L$ by a factor of 9 has been measured.

Figure 2:
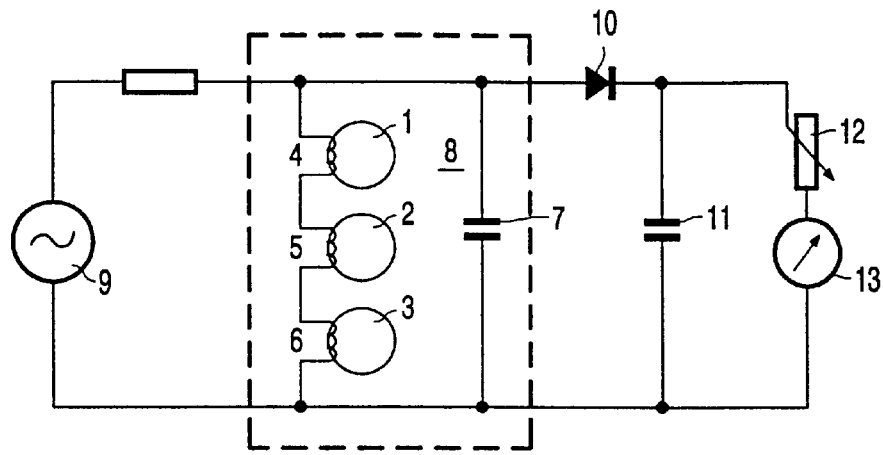
FIG. 2 shows an electrical circuit diagram for the weighing apparatus in accordance with the invention; while in FIG. 3 an elaborate electrical circuit diagram of said weighing apparatus is shown.
Figure 3:
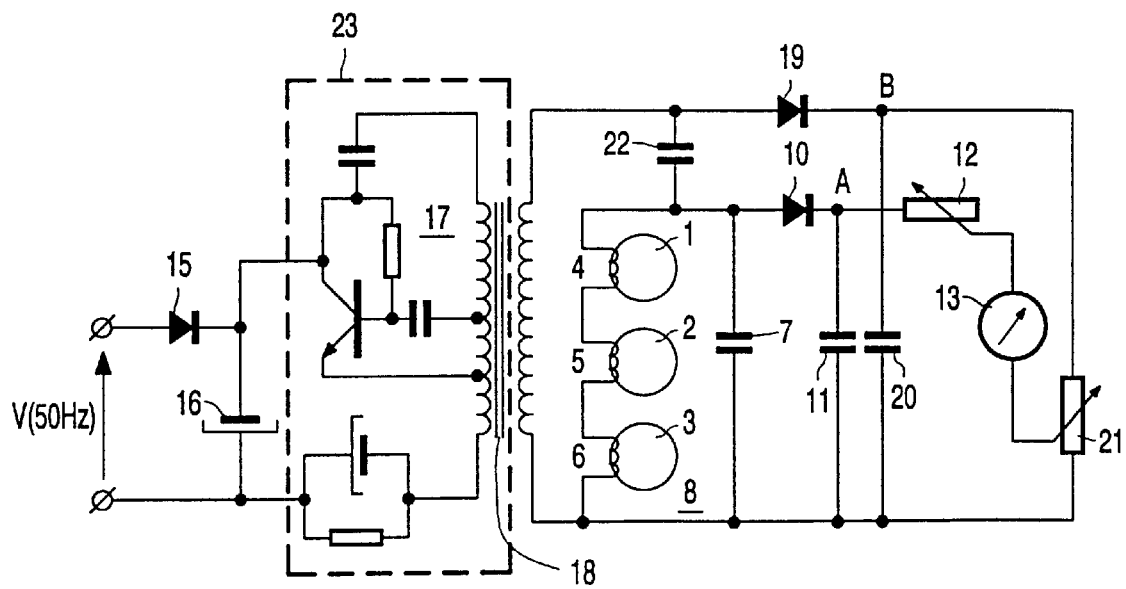

In the FIGS. 2 and 3, three ferrite cores, in particular ferrite rings 1, 2 and 3, are shown around each of which a coil 4, 5 and 6, respectively, is provided. The coils are arranged in series and form a resonance circuit 8 together with the capacitor 7. Although it is not shown in the Figures, the three ferrite rings 1–3 are provided at the bottom of a flat box and they support a weighing plate which rests freely on said ferrite rings, so that the provision of an object to be weighed on the weighing plate causes the three-point support of the weighing plate to exert an increased mechanical pressure on the ferrite rings. The resultant magnetostrive effect will cause the permeability of the ferrite rings 1–3 to increase, which manifests itself in a change of the self-induction of the coils 4–6. To obtain a sharp resonance peak, the quality factor (or circuit quality) of the resonance circuit 8 is relatively high. As a result of a mechanical pressure change exerted on the ferrite rings 1–3, the overall self-induction L of the coils will undergo a change $\Delta L:L'=L\pm\Delta L$. As a result, the resonance frequency $\omega_r$ of the circuit 8 changes:

$$\omega'_r \approx \omega_r\left(1 \pm \frac{\Delta L}{L}\right).$$

In other words, the resonance peak shifts in the frequency range. By choosing a measuring frequency $\omega_m$ in the vicinity of the resonance frequency $\omega_r$, a small shift of the resonance peak already leads to a considerable change in the signal strength in the resonance circuit 8.

In FIG. 2, the power source, which applies a voltage of frequency $\omega_m$ across the resonance circuit, is indicated by the reference numeral 9. The output signal of the resonance circuit 8 is supplied via the rectifier diode 10 and the smoothing capacitor 11, across the adjustable resistor 12, to a current meter 13. By means of the adjustable resistor 12, the desired sensitivity of the current meter 13 can be fixed.

The more detailed electrical circuit diagram shown in FIG. 3 depicts an embodiment of the power source which applies a voltage of frequency $\omega_m$ across the resonance circuit. The standard 50 Hz alternating current derived from a transformer, not shown, is converted by means of the rectifier diode 15 and the smoothing capacitor 16 to a direct current. An AC voltage of the desired frequency $\omega_m$ is derived herefrom by a self-oscillating circuit 17. Via the transformer 18, this frequency is applied across the resonance circuit 8.

To ensure that the output signal of the resonance circuit can be set to zero in the current meter 13 when the ferrites are in the unloaded state, the voltage from the transformer 18 is applied via the rectifier diode 19 and the smoothing capacitor 20, across the adjustable resistor 21, to the current meter 13. To ensure also that the voltage in point B is higher than that in point A, a capacitor 22 is arranged in series with the resonance circuit.

It will be obvious that all kinds of modifications to the embodiment of the circuit diagram shown are possible. It is also possible to use a self-oscillating circuit instead of a tuned circuit having an external alternating current source. In particular, the outlined self-oscillating circuit 23 shown in FIG. 3 can be used for this purpose, with this difference that, instead of the core of the transformer, the primary windings thereof are used as the coil wound about the ferrites. Of course, the voltage applied across the self-oscillating circuit must then be supplied to a rectifier circuit and measuring circuit, such as those shown in FIG. 2 or 3.

Although three ferrite cores or rings are present in the example used herein, it will depend upon the application whether one or more ferrite cores or rings are used. It is also possible to use ferrite cores of different sizes and/or compositions. For example, a ferrite core with a polymer cover, or a core with a ferrite-polymer composition can be used.

In an alternative embodiment of the measuring circuit use can be made of known converters for converting a frequency difference to a voltage different; these converters are commercially available as IC.

What is claimed is:

1. A magnetostrictive stress sensor comprising a soft ferromagnetic body around at least a part of which an electric coil is wound, said coil-wrapped ferromagnetic body accommodated in a measuring circuit for measuring changes in self-induction of the coil under the influence of a mechanical pressure exerted on the ferromagnetic body, wherein the ferromagnetic body is a granular body formed of ferrite grains at least part of which grains have a size in a transition region between a one-domain and a two-domain state.

2. A magnetostrictive stress sensor as claimed in claim 1, wherein the ferromagnetic body is formed by a MnZn ferrite having a grain size in the range from 3 to 9 $\mu$m.

3. A magnetostrictive stress sensor as claimed in claim 1, characterized in that the ferromagnetic body is formed by a NiZn-ferrite, a MgMnZn-ferrite or a LiNiZn-ferrite having a grain size in the range from 1 to 5 $\mu$m.

4. A magnetostrictive stress sensor as claimed in claim 1 wherein the ferromagnetic body is a ferrite ring.

5. A magnetostrictive stress sensor as claimed in claim 1 wherein the grains have a size of between 1 to 9 $\mu$m.

6. A weighing apparatus as comprising at least one soft ferromagnetic body around at least a part of which an electric coil is wrapped, said at least one coil-wrapped ferromagnetic body accommodated in a measuring circuit for measuring changes in self-induction of the coil of the at least one coil-wrapped ferromagnetic body under the influence of a mechanical pressure exerted on the ferromagnetic body of said at least one coil-wrapped ferromagnetic body, and a support for an object being weighed, said support supported by said at least one coil-wrapped ferromagnetic body, wherein the at least one ferromagnetic body is a granular body formed of ferrite grains of which at least part of which grains have a size in a transition region between a one-domain and a two-domain state.

7. A weighing apparatus as claimed in claim 6, wherein the at least one coil-wrapped ferromagnetic body is an at least one coil-wrapped ferrite ring.

8. A weighing apparatus as claimed in claim 7, wherein the measuring circuit comprises a resonance circuit in which said at least one coil-wrapped ferrite ring is incorporated, and a change of self-induction of the coil of said at least one coil-wrapped ferrite ring is measured by determining whether there is a change in a signal strength of a measuring frequently, which measuring frequency is situated at a relatively small distance from a resonance frequency of the resonance circuit.

9. A weighing apparatus as claimed in claim 8, wherein a number of said coil-wrapped ferrite rings are provided, each of said coils incorporated in the resonance circuit.

* * * * *